(12) United States Patent
Belady et al.

(10) Patent No.: US 6,771,507 B1
(45) Date of Patent: Aug. 3, 2004

(54) POWER MODULE FOR MULTI-CHIP PRINTED CIRCUIT BOARDS

(75) Inventors: Christian L. Belady, McKinney, TX (US); Shaun L. Harris, McKinney, TX (US); Gary Wayne Williams, Rowlett, TX (US); Brent A. Boudreaux, Highland Village, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/355,707

(22) Filed: Jan. 31, 2003

(51) Int. Cl.[7] .............................................. H05H 7/20
(52) U.S. Cl. ...................... 361/704; 165/80.2; 165/80.3; 165/185; 257/718; 257/719; 257/722; 361/710; 361/715; 361/703; 361/719; 361/720; 361/721
(58) Field of Search ............................... 165/80.2, 80.3, 165/185; 257/706–707, 712–713, 718–719, 722, 726–727; 361/687–688, 707, 709–710, 715, 719–721, 703; 363/141, 144

(56) References Cited

U.S. PATENT DOCUMENTS

| | | | |
|---|---|---|---|
| 4,462,462 A | * | 7/1984 | Meagher et al. ............ 165/80.1 |
| 4,965,710 A | * | 10/1990 | Pelly et al. ............... 363/56.03 |
| 5,214,563 A | * | 5/1993 | Estes .......................... 361/776 |
| 5,548,090 A | | 8/1996 | Harris |
| 5,587,882 A | | 12/1996 | Patel |
| 5,729,433 A | | 3/1998 | Mok |
| 5,734,555 A | | 3/1998 | McMahon |
| 5,801,924 A | | 9/1998 | Salmonson |
| 5,804,872 A | | 9/1998 | Miyano et al. |
| 5,828,125 A | | 10/1998 | Burns |
| 5,862,038 A | * | 1/1999 | Suzuki et al. ............... 361/704 |
| 5,901,040 A | | 5/1999 | Cromwell et al. |
| 5,930,115 A | | 7/1999 | Tracy et al. |
| 5,966,291 A | * | 10/1999 | Baumel et al. .............. 361/707 |
| 5,986,887 A | | 11/1999 | Smith et al. |
| 5,995,370 A | | 11/1999 | Nakamori |
| 6,058,013 A | | 5/2000 | Christopher et al. |
| 6,064,573 A | * | 5/2000 | Morton ....................... 361/704 |
| 6,166,937 A | * | 12/2000 | Yamamura et al. ......... 363/141 |
| 6,191,945 B1 | | 2/2001 | Belady et al. |
| 6,212,076 B1 | | 4/2001 | MacQuarrie et al. |
| 6,219,236 B1 | | 4/2001 | Hirano et al. |
| 6,239,366 B1 | | 5/2001 | Hsuan et al. |
| 6,285,550 B1 | | 9/2001 | Belady |
| 6,400,566 B1 | | 6/2002 | Ootori |
| 6,414,867 B2 | * | 7/2002 | Suzuki et al. ............... 363/141 |
| 6,462,410 B1 | | 10/2002 | Novotny et al. |
| 6,483,704 B2 | | 11/2002 | Ulen et al. |
| 6,490,161 B1 | | 12/2002 | Johnson |
| 6,504,722 B2 | * | 1/2003 | Vittet et al. ................. 361/704 |
| 6,621,701 B2 | * | 9/2003 | Tamba et al. ............... 361/699 |

* cited by examiner

*Primary Examiner*—Gregory D. Thompson
(74) *Attorney, Agent, or Firm*—Kevin M. Hart

(57) ABSTRACT

A power module assembly for multi-chip printed circuit boards: A heat distribution plate has first and second fields of receptacles integrally formed therein. The receptacles are populated with first and second fields of thermally-conductive pins. A power module printed circuit board is mounted to the heat distribution plate and has first and second clearance holes formed therein. The first and second fields of pins protrude through the first and second clearance holes. A multi-chip printed circuit board may be mounted underneath the power module such that the thermally-conductive pins contact a surface of first and second supplied chips. The supplied chips are physically close to the power module, and thermal management for the supplied chips is provided by virtue of contact between the supplied chips and the thermally-conductive pins. Space on the multi-chip printed circuit board is conserved.

7 Claims, 5 Drawing Sheets

POWER MODULE FOR MULTI-CHIP PRINTED CIRCUIT BOARDS

FIELD OF THE INVENTION

This invention relates generally to power modules for multi-chip printed circuit boards.

BACKGROUND

Many modern integrated circuit chips, such as microprocessors for example, require relatively high supply current delivered at a very tightly controlled voltage. It is common, therefore, to employ a special-purpose module including voltage converters, voltage regulators and the like to supply power to such a chip. And it is known that disposing the power module physically close to the supplied chip helps to reduce negative effects associated with the delivery of power via cables.

Recently it has become popular to deploy two or more high-power chips on a single multi-chip printed circuit board. Among the problems presented by this approach is how to dispose the power module sufficiently close to the supplied chips while at the same time providing adequate thermal management for the supplied chips and conserving space on the printed circuit board.

It is an object of the present invention to provide a power module for a multi-chip printed circuit board such that: (1) the power module is disposed physically close to the chips on the printed circuit board, (2) thermal management is provided for the supplied chips, and (3) space is conserved on the printed circuit board.

SUMMARY OF THE INVENTION

In a power module assembly according to a preferred embodiment of the invention, a heat distribution plate is provided having first and second fields of receptacles integrally formed therein. The receptacles are populated with first and second fields of thermally-conductive pins capable of moving independently in a direction orthogonal to the plate. A power module printed circuit board is mounted to the heat distribution plate and has first and second clearance holes formed therein. The first and second fields of pins protrude through the first and second clearance holes. A multi-chip printed circuit board may be mounted underneath the power module such that the thermally-conductive pins contact a surface of first and second supplied chips. In this manner, the supplied chips are physically close to the power module, and thermal management for the supplied chips is provided by virtue of contact between the supplied chips and the thermally-conductive pins. Z-axis compliance provided by the pin/receptacle assemblies enhances thermal conductivity even when the supplied chips have differing heights relative to the top of the multi-chip printed circuit board. Space on the multi-chip printed circuit board is conserved because the power module is not part of the multi-chip printed circuit board, but rather is mounted on a separate printed circuit board disposed over the top of the multi-chip printed circuit board.

DETAILED DESCRIPTION OF THE PREFERRED EMBODIMENTS

Figure 1:
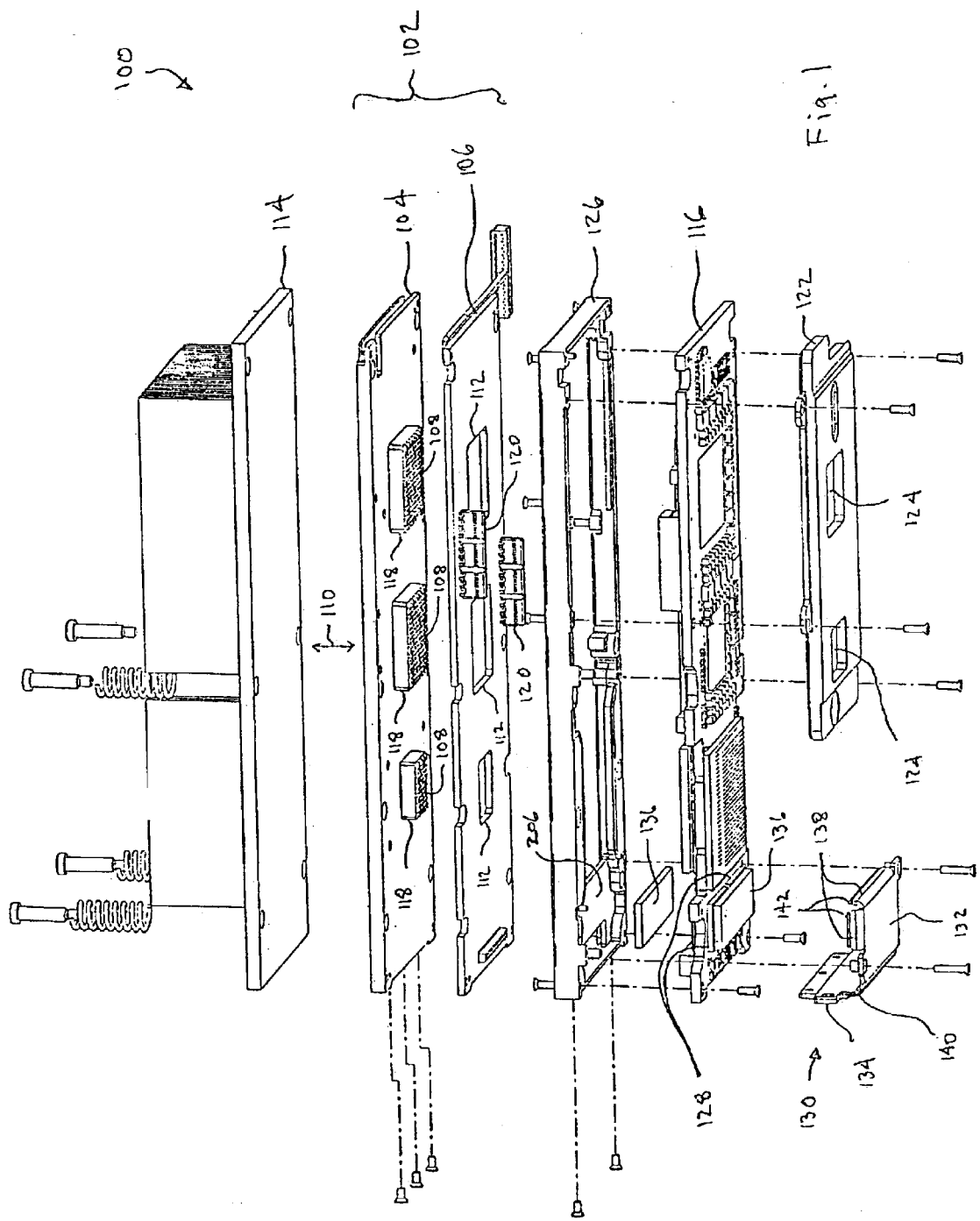
FIG. 1 is an exploded bottom oblique view of a printed circuit board stack that includes a power module assembly according to a preferred embodiment of the invention.

FIGS. 1–5 illustrate a printed circuit board stack 100 that includes a power module according to a preferred embodiment of the invention. Stack 100 also includes cooling apparatus that is claimed in U.S. patent application Ser. No. 10/355,424, filed Jan. 31, 2003, titled "Cooling Apparatus for Stacked Components".

Power Module. Power module assembly 102 includes a heat distribution plate 104 and a power module printed circuit board 106. Heat distribution plate 104 includes fields 108 of receptacles 300 populated with thermally-conductive pins 302. The pins 302 are capable of independent movement in the direction 110 orthogonal to plate 104. Power module printed circuit board 106 includes clearance holes 112 adapted to clear pin fields 108. Board 106 is preferably mounted to the underside of heat distribution plate 104 by means of fasteners such as screws. When this is done, pin fields 108 protrude through clearance holes 112 on the underside of power module printed circuit board 106 so that the pins may make contact with the top surfaces of heat-generating integrated circuit chips 200 mounted on a multi-chip printed circuit board 116. This contact provides thermal management for chips 200 by conducting heat from the chips into heat distribution plate 104. An active or a passive heat sink device 114 may optionally be mounted over plate 104 to enhance the removal of heat therefrom.

One or more of pin fields 108 may be disposed on raised bosses 118 integrally formed on plate 104. In such an embodiment, the bosses themselves may protrude through clearance holes 112 to shorten the lengths of pins 302 necessary for adequate contact with chips 200. Because of the forces applied against chips 200 by pins 302, bowing of multi-chip printed circuit board 116 may occur. If so, it may be desirable to mount a bolster plate 122 to the underside of board 116 to prevent or reduce the bowing. Such a bolster plate 122 may optionally include raised bosses 124 to provide direct support against board 116 under one or more of the chips 200. Optionally, an insulator maybe interposed between bosses 124 and circuit board 116. Bolster plate 122 may be fastened to any suitably rigid member, such as heat distribution plate 104 or an intermediate frame 126.

A power connector component 120 may be mounted to the underside of power module printed circuit board 106. And a corresponding power connector component 202 may be mounted to the top side of multi-chip printed circuit board 106. When printed circuit board stack 100 is assembled, power connector components 120, 202 mate by virtue of their proximity and alignment. Such connectors may be used to efficiently transfer power between power module printed circuit board 106 and multi-chip printed circuit board 116. In one embodiment, blade-style power connector components were used for this purpose (as illustrated). In other embodiments, alternative power connectors may be used. When power connector components 120, 202 are oriented orthogonal to their respective host circuit boards as shown, and the circuit boards oriented parallel to the heat distribution plate, alignment and automatic mating of the connector components are easily achieved.

Although any suitably rigid heat conducting material may be used to make heat distribution plate 104 and intermediate frame 126, in one embodiment aluminum was used for this purposed because of the combination of its strength, ease of machining, and thermal conductivity. Bolster plate 122 may also be made using any suitably rigid material. In an embodiment, bolster plate 122 was made of steel for strength. Pin fields 108 may be constructed according to any suitable technique, including for example those disclosed in U.S. patent application Ser. No. 10/074,642, filed Feb. 12, 2002, titled "Thermal Transfer Interface System and Methods," which by this reference is hereby incorporated entirely as if fully set forth in this application.

Figure 2:
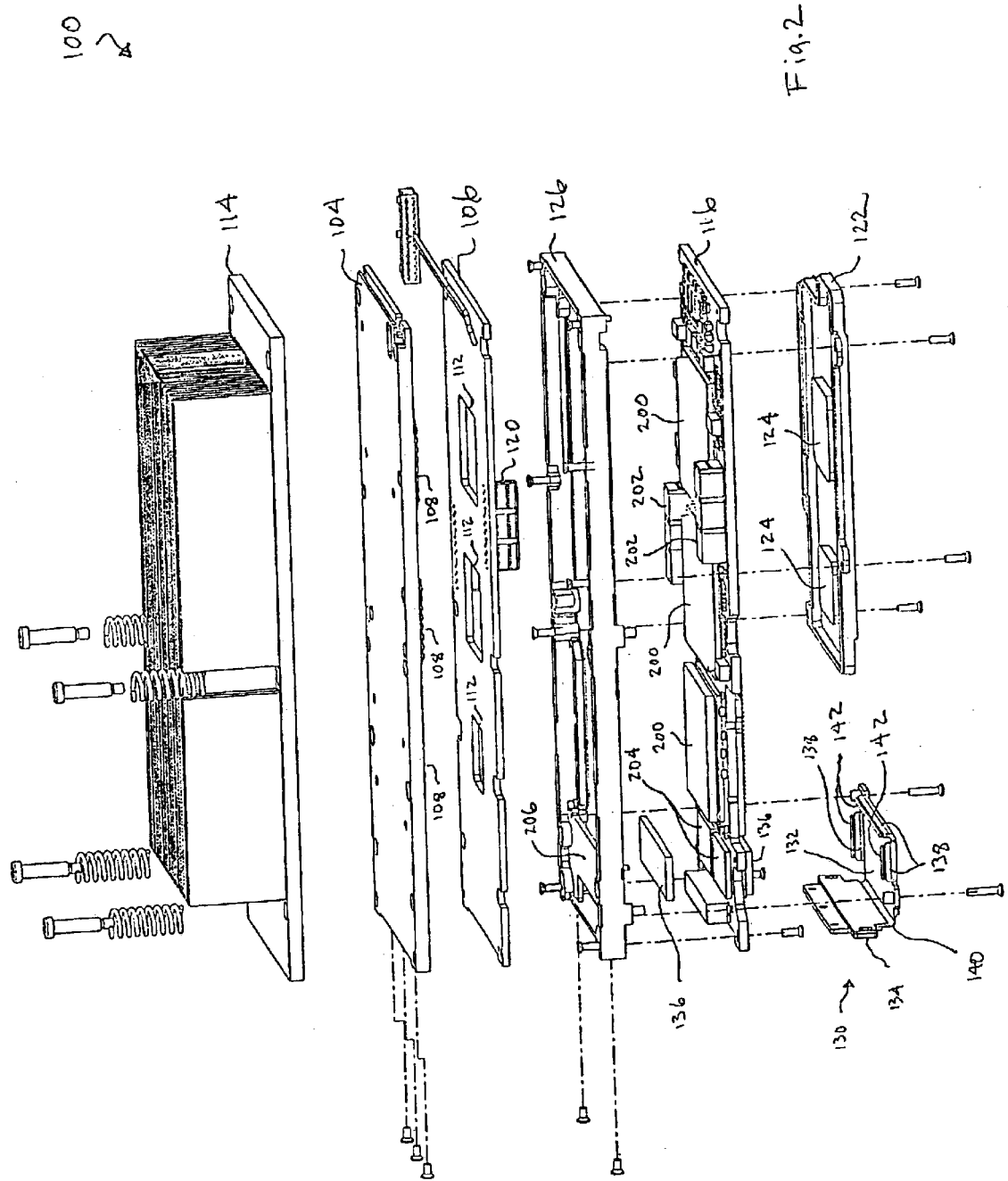
FIG. 2 is an exploded top oblique view of the printed circuit board stack of FIG. 1.
Figure 3:
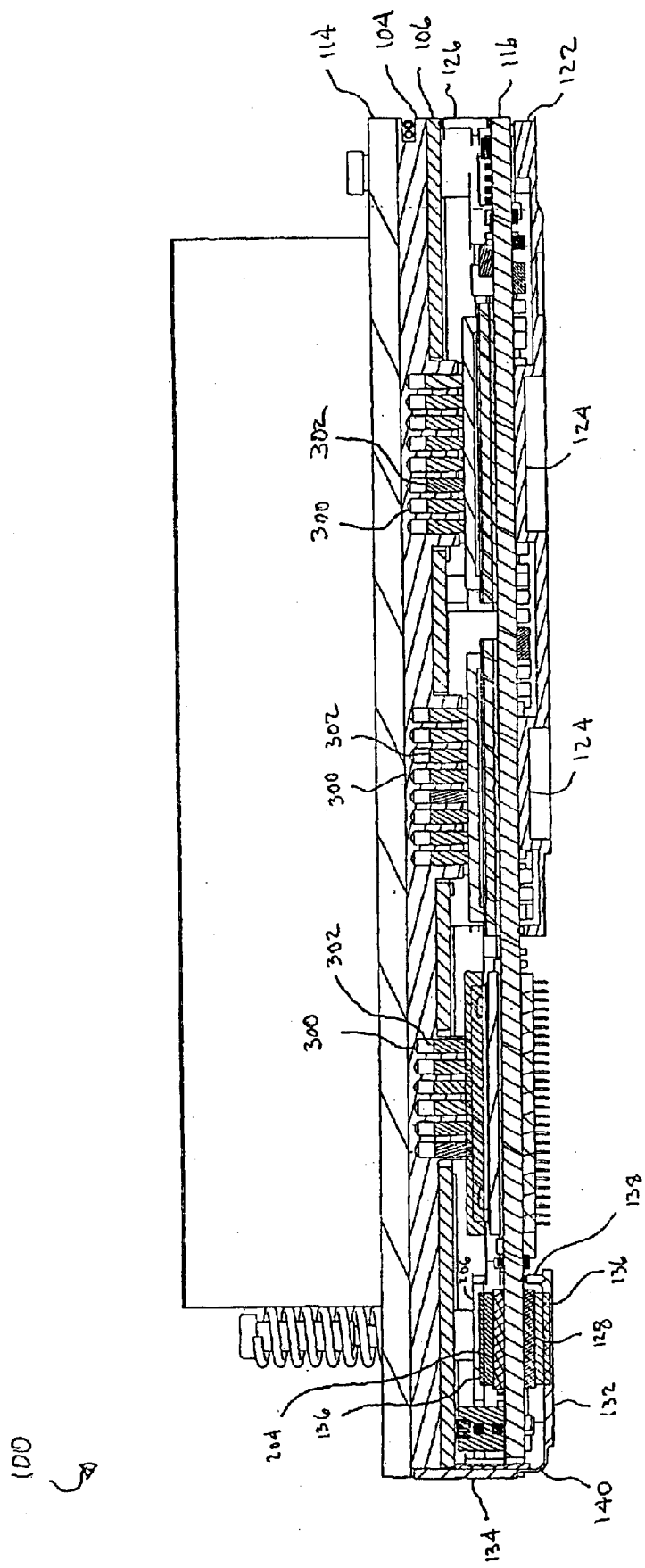
FIG. 3 is a sectional view of the printed circuit board stack of FIG. 1.
Figure 4:
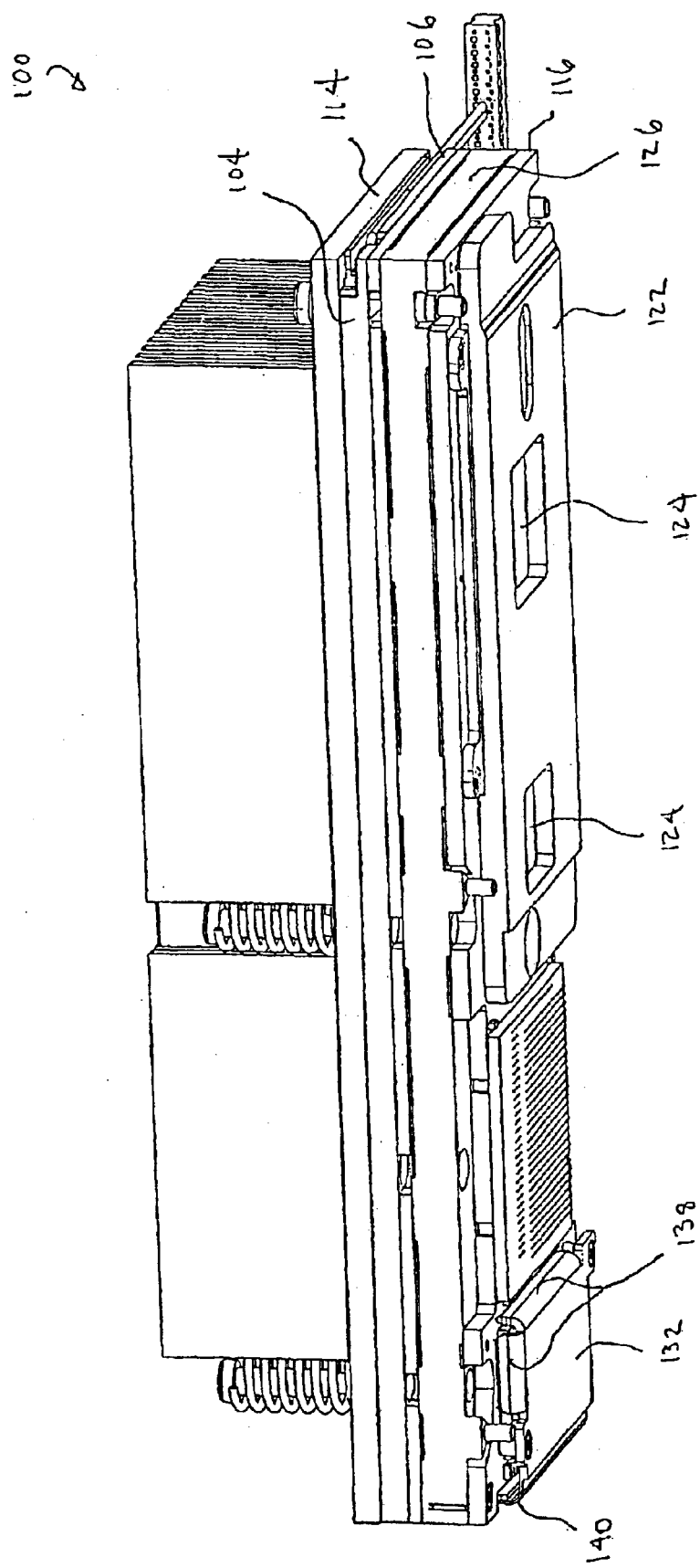
FIGS. 4 and 5 are assembled bottom and top oblique views, respectively, of the printed circuit board stack of FIG. 1.
Figure 5:
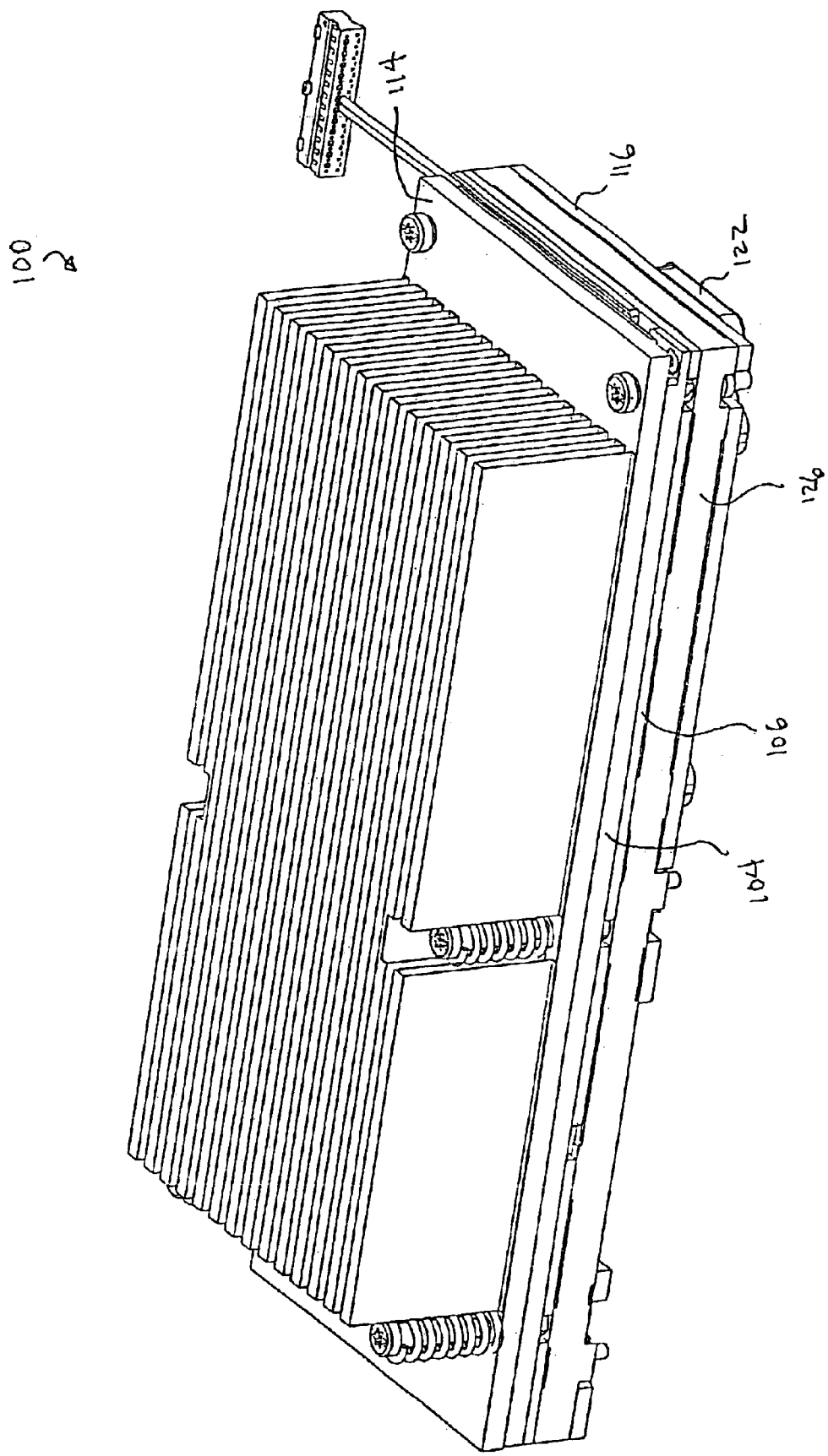

Cooling Apparatus. Printed circuit board 116 may include heat-generating components mounted on its top side as well as its bottom side. For example, heat-generating components 128 may be mounted on one side of board 116, and heat generating components 204 may be mounted on the other side of board 116 as shown in FIGS. 1–3. A cross-member 206 may be integrally formed on frame 126 and disposed over components 204. A thermally-conductive strap 130 is provided having first and second legs 132, 134. In an embodiment, strap 130 was made of copper because of the desirable thermal conductivity of that material. In other embodiments, other thermally-conductive materials may be used.

When circuit boards 106 and 116 are assembled, cross-member 206 is thermally coupled to components 204, and leg 132 of strap 130 is thermally coupled to components 128. The thermal couplings may be achieved by direct contact between the cross-member or strap and the corresponding components, or optionally a compliant thermally-conductive material may be interposed between the strap or cross-member and the corresponding components. For example, in one embodiment, die-cut wafers 136 of thermally-conductive material were interposed as shown in FIGS. 1–3. One example of a material suitable to use for this purpose would be "T-PUTTY-502," manufactured and sold by THERMAGON. Another example would be thermal grease. Leg 134 of strap 130 is thermally coupled to one end of frame 126 and to one end of heat distribution plate 104. The latter thermal coupling may also be accomplished by direct contact between strap 130 and the frame and plate, or optionally a compliant thermally-conductive material such as those just mentioned may be interposed between the strap and the frame or plate.

An active or passive heat sink assembly 114 may optionally be thermally-coupled to heat distribution plate 104 to enhance removal of heat from components 128, 204. Note that the cooling apparatus just described may be beneficially employed regardless of whether or not heat distribution plate 104 includes pin-fields 108, and pin fields 108 may be beneficially employed regardless of whether the just-described cooling apparatus is included in the assembly. Similarly, circuit board 106 need not be a power module such as the one described herein above in order for the just-described cooling apparatus to be effectively applied.

Preferably, the portion of leg 132 adjacent components 128 is a substantially planar surface extending over the top surface of components 128 as shown. Leg 132 may also include one or more walls 138 extending between the planar surface of the leg and an electrically conductive trace on circuit board 116. If so, then strap 130 functions not only as a heat removal device, but also helps to contain electromagnetic energy radiating from components 128. (For such an application, strap 130 should not only be thermally conductive but electrically conductive as well. Copper, of course, exhibits both behaviors.) Walls 138 may be sectioned or may be formed as one continuous wall. In the arrangement shown, wall sections 138 form three sides of a rectangle around components 128, and the transverse dimension of leg 134 forms a fourth side of the rectangle, thus completing at least a partial electromagnetic enclosure around components 128. To further enhance electrical contact between walls 138 and circuit board 116, a compliant electrically conductive material 142 may optionally be interposed between the edge of wall 138 and circuit board 116. One example of a material suitable for this purpose would be a liquid-dispensed material having part number 5537 manufactured and sold by CHOMEKICS.

In any printed circuit board stack such as stack 100, mechanical tolerances are additive. To accommodate such a tolerance build-up, legs 132, 134 of strap 130 may be joined at an elastic elbow 140. If so, then legs 132, 134 may be moved slightly relative to one another during assembly of stack 100. An elastic elbow 140 may be created, for example, by manufacturing strap 130 from one unitary piece of metal and causing the juncture between legs 132, 134 to be thinner than either of the two legs. Alternatively, braided metal may be used to provide an elastic elbow junction between legs 132, 134. Also, it is beneficial to provide over-sized screw holes on legs 132, 134 for attachment of strap 130 to frame 126 and plate 104. The over-sized holes help to accommodate varying tolerances in stack 100.

While the invention has been described in detail in relation to a preferred embodiment thereof, the described embodiment has been presented by way of example and not by way of limitation. It will be understood by those skilled in the art that various changes may be made in the form and details of the described embodiment without deviating from the spirit and scope of the invention as defined by the appended claims.

What is claimed is:

1. A power module assembly, comprising:

a heat distribution plate having at least first and second fields of receptacles integrally formed therein and populated with first and second fields of thermally-conductive pins, respectively, the pins capable of moving independently in a direction orthogonal to the plate responsive to forces applied to them; and a power module printed circuit board mounted to the heat distribution plate and having first and second clearance holes formed therein;

wherein the first and second fields of pins protrude through the first and second clearance holes.

2. The power module assembly of claim 1, further comprising:

a multi-chip printed circuit board mounted adjacent to the power module printed circuit board and having first and second heat generating chips mounted thereon;

wherein a surface of the first heat generating chip contacts the first field of pins, and a surface, of the second heat generating chip contacts the second field of pins.

3. The power module assembly of claim 1, wherein:

the first and second fields of receptacles are disposed on first and second bosses, respectively, the bosses integrally formed on the heat distribution plate.

4. The power module assembly of claim 3, wherein:

the first and second bosses protrude through the first and second clearance holes.

5. The power module assembly of claim 2, further comprising:

a first power connector component mounted to the power module printed circuit board; and a second power connector component mounted to the multi-chip printed circuit board;

wherein the first and second power connector components mate.

6. The power module assembly of claim 5, wherein:

the first and second power connector components comprise a blade-style connector assembly.

7. The power module assembly of claim 5, wherein:

the first and second power connector components are oriented orthogonal to the heat distribution plate; and the planes of the power module circuit board and the multi-chip circuit board are oriented parallel to the heat distribution plate.

* * * * *